(12) United States Patent
Suzuki et al.

(10) Patent No.: US 11,111,412 B2
(45) Date of Patent: Sep. 7, 2021

(54) POLISHING COMPOSITION, METHOD FOR PRODUCING POLISHING COMPOSITION, AND POLISHING METHOD

(71) Applicant: FUJIMI INCORPORATED, Kiyosu (JP)

(72) Inventors: Shota Suzuki, Kiyosu (JP); Yoshihiro Izawa, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/316,970

(22) PCT Filed: Jun. 12, 2017

(86) PCT No.: PCT/JP2017/021691
§ 371 (c)(1),
(2) Date: Jan. 10, 2019

(87) PCT Pub. No.: WO2018/012173
PCT Pub. Date: Jan. 18, 2018

(65) Prior Publication Data
US 2019/0225836 A1    Jul. 25, 2019

(30) Foreign Application Priority Data

Jul. 15, 2016  (JP) .............................. JP2016-140624

(51) Int. Cl.
*C09G 1/02*    (2006.01)
*C09K 3/14*    (2006.01)
(Continued)

(52) U.S. Cl.
CPC ................ *C09G 1/02* (2013.01); *B24B 37/00* (2013.01); *C09K 3/1409* (2013.01); *C09K 3/1436* (2013.01); *H01L 21/31053* (2013.01)

(58) Field of Classification Search
CPC ...... C09K 3/1409; C09K 3/1436; C09G 1/12; H01L 21/31053
(Continued)

(56) References Cited

U.S. PATENT DOCUMENTS 5,759,917 A   6/1998  Grover et al.
9,012,327 B2  4/2015  Guo
(Continued)

FOREIGN PATENT DOCUMENTS

JP    2001-507739 A   6/2001
JP    2002-080217 A   3/2002
(Continued)

OTHER PUBLICATIONS

Non-Final Office Action on U.S. Appl. No. 16/317,625 dated May 25, 2021.
(Continued)

*Primary Examiner* — Binh X Tran
(74) *Attorney, Agent, or Firm* — Foley & Lardner LLP

(57) ABSTRACT

The present invention provides a polishing composition which can polish an object to be polished at a high polishing speed and with fewer scratches (defects). The present invention is a polishing composition containing silica of which a maximum peak height in a weight change rate distribution curve obtained by thermogravimetric measurement in a range of 25° C. or higher and 250° C. or lower is −0.011 or more and less than 0, a pH at 25° C. of the polishing composition being less than 6.0.

13 Claims, 1 Drawing Sheet

(51) Int. Cl.
*B24B 37/00* (2012.01)
*H01L 21/3105* (2006.01)

(58) Field of Classification Search
USPC .............................. 438/692, 693; 252/79.1
See application file for complete search history.

(56) References Cited

U.S. PATENT DOCUMENTS

| | | | |
|---|---|---|---|
| 2002/0018743 | A1 | 2/2002 | Katsuro et al. |
| 2008/0006057 | A1* | 1/2008 | Nishimoto ............... C09G 1/02 65/61 |
| 2011/0027997 | A1* | 2/2011 | Shinoda ................ B24B 37/044 438/693 |
| 2012/0094491 | A1* | 4/2012 | Kanamaru .......... H01L 21/3212 438/693 |
| 2013/0092871 | A1 | 4/2013 | Sekiguchi et al. |
| 2014/0295738 | A1* | 10/2014 | Matsui ................ C09K 3/1454 451/41 |
| 2015/0376463 | A1* | 12/2015 | Fu ........................... C09G 1/02 438/693 |
| 2019/0292407 | A1* | 9/2019 | Suzuki ................ H01L 21/3212 |

FOREIGN PATENT DOCUMENTS

| | | |
|---|---|---|
| JP | 2008-013655 A | 1/2008 |
| JP | 2008-273780 A | 11/2008 |
| JP | 2009-289885 A | 12/2009 |
| JP | 2012-111869 A | 6/2012 |
| JP | 2015-063687 A | 4/2015 |
| WO | WO-2009/128494 A1 | 10/2009 |
| WO | WO-2011/162265 A1 | 12/2011 |

OTHER PUBLICATIONS

Office Action on Japanese Application No. 2018-527454 dated May 12, 2021, with English translation.
Office Action on Japanese Application No. 2018-527457 dated May 12, 2021, with English translation.

* cited by examiner

POLISHING COMPOSITION, METHOD FOR PRODUCING POLISHING COMPOSITION, AND POLISHING METHOD

CROSS-REFERENCE TO RELATED APPLICATIONS

This application is a National Phase of International Patent Application No. PCT/JP2017/021691 filed on Jun. 12, 2017, which claims priority to Japanese Patent Application No. 2016-140624 filed on Jul. 15, 2016. The contents of these applications are herein incorporated by reference in their entirety.

TECHNICAL FIELD

The present invention relates to a polishing composition, a method for producing a polishing composition, and a polishing method.

BACKGROUND ART

In recent years, a so-called chemical mechanical polishing (CMP) technique for polishing and flattening a semiconductor substrate in producing a device is used in accordance with multilayer wiring on a surface of a semiconductor substrate. CMP is a method for flattening a surface of an object to be polished (polishing object) such as a semiconductor substrate by using a polishing composition (slurry) containing abrasive grains such as silica, alumina, or ceria, an anti-corrosion agent, a surfactant, or the like. The object to be polished (polishing object) is silicon, polysilicon, silicon oxide film (silicon oxide), silicon nitride, a wiring or a plug which consists of metal, or the like.

As a CMP slurry for polishing a substrate containing an oxygen atom and a silicon atom such as silicon oxide, for example, JP 2001-507739 A (corresponding to U.S. Pat. No. 5,759,917 A) discloses an aqueous chemical machine polishing composition containing a salt, a soluble cerium, carboxylic acid, and silica (particularly fumed silica). Further, J P 2015-063687 A (corresponding to U.S. Pat. No. 9,012,327 A) discloses a chemical machine polishing composition containing water, 0.1 to 40% by weight of colloidal silica particles, and 0.001 to 5% by weight of an additive (pyridine derivative).

SUMMARY OF INVENTION

However, there is a problem in that, although the aqueous chemical machine polishing composition described in JP 2001-507739 A (corresponding to U.S. Pat. No. 5,759,917 A) improves a polishing speed of a substrate, many scratches are generated on a surface of the substrate.

Further, there is a problem in that, although the chemical machine polishing composition described in JP 2015-063687 A (corresponding to U.S. Pat. No. 9,012,327 A) suppresses scratches on a surface of a substrate, a polishing speed is not sufficient.

As described above, regarding polishing an object to be polished containing an oxygen atom and a silicon atom, a polishing composition that can solve problems of improving the polishing speed and reducing the scratches (defects) that are contradictory with each other, has been desired.

In this regard, the present invention has been made in view of the above-described circumstances, and an object thereof is to provide a polishing composition which can polish an object to be polished (particularly, an object to be polished containing an oxygen atom and a silicon atom) at a high polishing speed and can reduce scratches (defects) on a surface of the object to be polished.

The inventors have conducted intensive studies to solve the above-described problems. As a result, the inventors have found that the above-described problems are solved by a polishing composition which uses silica having a predetermined height of a maximum peak height in a weight change rate distribution curve obtained by thermogravimetric measurement in a range of 25° C. or higher and 250° C. or lower, and has a pH of less than 6.0.

That is, the above-described object can be achieved by a polishing composition containing silica of which a maximum peak height in a weight change rate distribution curve obtained by thermogravimetric measurement in a range of 25° C. or higher and 250° C. or lower is −0.011 or more and less than 0, a pH at 25° C. of the polishing composition being less than 6.0.

DESCRIPTION OF EMBODIMENTS

An aspect of the present invention is a polishing composition containing silica of which a maximum peak height in a weight change rate distribution curve obtained by thermogravimetric measurement in a range of 25° C. or higher and 250° C. or lower is −0.011 or more and less than 0, a pH at 25° C. of the polishing composition being less than 6.0. The polishing composition having such a configuration can polish an object to be polished (particularly, an object to be polished containing an oxygen atom and a silicon atom) at a high polishing speed and reduce scratches (defects) on a surface of the object to be polished.

In the present specification, the maximum peak in the weight change rate distribution curve obtained by subjecting silica to the thermogravimetric measurement in a range of 25° C. or higher and 250° C. or lower is also referred to as "TG peak."

Figure 1:
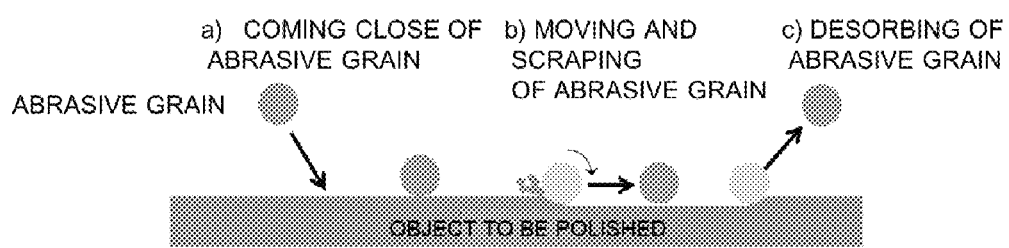
FIG. 1 is a schematic diagram for describing an action of abrasive grains to an object to be polished.

In the related art, in semiconductor devices with an increasing number of stacked layers, there is a demand for development in a technique of polishing an interlayer insulating film (for example, a $SiO_2$ film) at a higher polishing speed. In general, a mechanical action of abrasive grains polishing an object to be polished is based on a mechanism as described below. That is, as illustrated in FIG. 1, the abrasive grains come close to the object to be polished (a) of FIG. 1). Then, by the abrasive grains moving on the object to be polished, the surface of the object to be polished is scraped (polished) (b) of FIG. 1), and finally, the abrasive grains are desorbed from the object to be polished (c) of FIG. 1). Of the above-described actions, in the related art, in order to achieve a high polishing speed, focusing on a step of the abrasive grains coming close to the object to be polished (a) of FIG. 1), it has been tried to improve polishing by the action of the abrasive grain by increasing the frequency of the abrasive grain coming close and/or contacting to the object to be polished. As a method of increasing of the frequency of the abrasive grain coming close and/or contacting to the object to be polished, for example, there have been proposed a method of increasing the number of abrasive grains, a method of increasing the size of abrasive grains, a method of using abrasive grains each having a different shape, a method of using abrasive grains having a zeta potential with a sign opposite to that of an object to be polished, a method of adding a salt to decrease absolute values of zeta potentials of abrasive grains and an object to be polished, and the like. However, in order to sufficiently meet a demand for a polishing speed higher than a polishing speed in the case of recent years and a demand for reduction of scratches (defects), there has been difficulty to fulfil the demands only by simply combining existing techniques as described above.

The inventors have conducted intensive studies to solve the above-described problems. As a result, the inventors have found that both a high polishing speed and reduction of scratches (defects) can be achieved by using silica (abrasive grains) exhibiting a predetermined behavior in thermogravimetric analysis and setting the pH of the polishing composition to be relatively low. Although the technical scope of the present invention is not limited, a mechanism to be speculated will be described below using, as an example, the case of using a silica dispersion liquid using water as a dispersing medium.

It is considered that a film of a dispersing medium molecule (water molecule) is formed on a surface of silica particles used in the polishing composition through hydrogen bonding by a surface silanol group, or the like. When the silica having such a dispersing medium molecular (water molecular) film is provided to thermogravimetric analysis (TG), as the heating temperature (measurement temperature) is increased from a starting temperature of about room temperature, a decrease in weight, which is considered to be caused by evaporation of the dispersing medium (for example, water) covering the particle surface, is observed, and when the temperature is further increased, formation of an aggregate by dehydrating condensation between silanol groups, and further, a behavior such as particle growth by fusion between particles are exhibited. Of these, since a decrease in weight by evaporation of the dispersing medium (for example, water) covering the particle surface occurs usually at 250° C. or lower, it is considered that the maximum peak (TG peak) in a range of 25° C. or higher and 250° C. or lower in the present invention is assumedly caused by evaporation of the dispersing medium (for example, water) covering the particle surface. Therefore, the fact that the peak is small is speculated to reflect the fact that the amount of the dispersing medium (for example, water) covering the particle surface is small (a dispersing medium molecular coating film on the surface of the abrasive grains is thin). In the case of using silica in which such a dispersing medium molecular coating film is thin (the amount of bound water is small and thus the TG peak is small) as the polishing composition, since the distance between the silica and the object to be polished at the time of polishing is short, the silica can come close to the object to be polished at a high frequency and with ease. For this reason, even in the case of a small amount (low concentration) of the silica, the silica comes close to the object to be polished efficiently (at a high frequency), so that the surface of the object to be polished is efficiently scraped (polished). Particularly, in polishing of an object to be polished containing an oxygen atom and a silicon atom, which is produced using tetraethylorthosilicate (TEOS) as a raw material, in a case where the water molecular film is thin (the amount of bound water is small and thus the TG peak is small), since the distance between the silica particles and the surface of the object to be polished at the time of polishing is short, the silanol group on the surface of the silica and the silanol group on the surface of the object to be polished are more easily bonded. Further, it is considered that charge-based interaction also involves in the relation between the silica particles and the surface of the object to be polished in addition to the hydrogen bonding. In the present invention, it is considered that, by setting the pH of the composition to less than 6.0, the charge-based interaction between the silica particles and the surface of the object to be polished is suitably exhibited. Therefore, the time for the silica particles moving on the surface of the object to be polished becomes longer. Thus, since the time for the silica particles being desorbed from the object to be polished is long, the silica particles scrape (polish) the surface of the substrate fora longer time (more efficiently), and thus the polishing speed can be enhanced. Further, since the moving distance of the silica particles on the surface of the object to be polished is long as described above, scratches existing on the surface of the object to be polished can be scraped (removed) during the movement of the silica particles. For this reason, when the TG peak of the silica is small and the pH of the polishing composition is less than 6.0, it is considered that the polishing speed can be enhanced and scratches (defects) can be reduced.

Further, according to the polishing composition as set forth in one aspect of the present invention, since it is considered that the silica (abrasive grains) comes close to the object to be polished at a high frequency and with ease and exists on the surface of the object to be polished for a long time, even in the case of a lower concentration of silica, the object to be polished can be polished at a high polishing speed, and according to this, occurrence of scratches (defects) can be further reduced, which is also excellent from the viewpoint of the cost.

Hereinafter, the present invention will be described in detail. Incidentally, unless otherwise specified, operations and measurements of a physical property or the like are carried out at conditions including room temperature (20 to 25° C.)/relative humidity of 40 to 50% RH.

<Polishing Composition>

The polishing composition according to one aspect of the present invention contains silica of which a maximum peak height in a weight change rate distribution curve obtained by thermogravimetric measurement in a range of 25° C. or higher and 250° C. or lower is −0.011 or more and less than 0, and has a pH at 25° C. of less than 6.0.

The "thermogravimetric measurement" is a method of continuously measuring a weight of a sample while a heating temperature is increased at a certain rate, tracking a change in weight of the sample due to heating, and then analyzing thermal characteristics of the sample. The "thermogravimetric measurement" in the present specification is, specifically, performed by a method described in Examples.

The "weight change rate distribution curve" in the present specification is a curve obtained by Gaussian fitting weight change rate distribution in which a weight change rate per unit area of the sample is plotted on the vertical axis and a measurement temperature (heating temperature) is plotted on the horizontal axis, on the basis of the result of a change in weight obtained by the thermogravimetric measurement. The weight change rate per unit area of the sample is, specifically, a value obtained by a method described in Examples.

The polishing composition according to one aspect of the present invention has a feature of using silica of which a maximum peak height in a weight change rate distribution curve obtained by thermogravimetric measurement in a range of 25° C. or higher and 250° C. or lower is −0.011 or more and less than 0. The maximum peak (TG peak) in the weight change rate distribution curve in the range of 25° C. or higher and 250° C. or lower is considered to be a change in weight measured on the basis of evaporation (loss) of a dispersing medium molecular film (for example, a water molecular film) existing on the surface of the silica. Silica having a TG peak height of less than −0.011 (that is, a large change in weight) has an excessively large amount of a dispersing medium bonded to the silica (an excessively thick of a water molecular coating film on the surface of the silica particles), a distance between the silica particles and the surface of the object to be polished is too far, and the silica cannot come sufficiently close to the surface of the object to be polished. For this reason, the silica particles cannot exist on the surface of the object to be polished for a sufficient time period, and thus the polishing efficiency (polishing speed) is lowered. On the other hand, production of silica in which a TG peak is not detected (that is, silica having a TG peak height of 0) is technically difficult. From the viewpoint of achieving both the enhancement of the polishing speed and the reduction of scratches (defects) with a higher balance, the lower limit of the TG peak height of the silica is preferably −0.01 or more, more preferably −0.009 or more, and further preferably −0.008 or more. Further, from the viewpoint of achieving both the enhancement of the polishing speed and the reduction of scratches (defects) with a higher balance, the upper limit of the TG peak height of the silica is preferably −0.0001 or less, more preferably −0.005 or less, and further preferably less than −0.0064. In a preferable embodiment, the TG peak height of the silica is −0.01 or more and −0.0001 or less, in a more preferable embodiment, the TG peak height of the silica is −0.009 or more and −0.005 or less, and in a further preferable embodiment, the TG peak height of the silica is −0.008 or more and −0.0055 or less. In a still more preferable embodiment, the TG peak height of the silica is −0.007 or more and −0.0060 or less. With such a range, both the enhancement of the polishing speed and the reduction of scratches (defects) can be achieved with a higher balance. Particularly, with the above ranges, a high polishing speed can be achieved even with a composition having a low content of silica.

Since it is considered that the above-described TG peak is based on the dispersing medium molecular film (water molecular film) formed on the surface of the silica, the TG peak can be controlled by a method such as modification of a surface state of the silica. In the present invention, the silica is not particularly limited as long as the TG peak is in the above ranges, and, for example, the TG peak can be decreased by modifying the surface of the silica by the hydrothermal treatment, or for example, the TG peak can be increased by heating the silica in a strong acid or strong alkali liquid. A modification treatment of the surface state of the silica will be described in more detail using the hydrothermal treatment (hydrothermal reaction) as an example.

In the hydrothermal treatment (hydrothermal reaction), silica such as colloidal silica is charged in a pressure-tight container such as an autoclave together with water. The hydrothermal reaction is performed, for example, at 120° C. or higher and 300° C. or lower, preferably at 150° C. or higher and 180° C. or lower. At this time, the temperature increasing rate is, for example, 0.5° C./min or more and 5° C./min or less. After the temperature reaches a target reaction temperature, the hydrothermal reaction is performed for 0.1 hour or longer and 30 hours or shorter, preferably 0.5 hour or longer and 5.0 hours or shorter. The pressure at the time of the hydrothermal reaction is, for example, saturation water vapor pressure, and more specifically, is, for example, 0.48 MPa or more and 1.02 MPa or less. After a target reaction time elapses, in order to prevent excessive development of the hydrothermal treatment, it is preferable to rapidly cool the sample.

The polishing composition of the present invention essentially contains silica (silica particles) as the abrasive grains, and more preferably contains colloidal silica as the abrasive grains. That is, according to a preferable embodiment of the present invention, silica is colloidal silica. Examples of the method for producing colloidal silica include a soda silicate method, a sol-gel method, and the like, and colloidal silica produced by any of those methods is suitably used. However, from the viewpoint of reducing metal impurities, colloidal silica produced by a sol-gel method allowing production with high purity is preferable.

Herein, the shape of the silica (abrasive grains) is not particularly limited, and may be a spherical shape or a non-spherical shape, and a spherical shape is preferable.

The size of the silica (abrasive grains) is not particularly limited. For example, the average primary particle size of the silica (abrasive grains) is preferably 5 nm or more, more preferably 10 nm or more, further preferably 20 nm or more. As the average primary particle size of the silica increases, the polishing speed of the object to be polished by the polishing composition is enhanced. In addition, the average primary particle size of the silica is preferably 200 nm or less, more preferably 100 nm or less, and further preferably 50 nm or less. As the average primary particle size of the silica decreases, it is easy to obtain a surface with fewer defects and a small roughness degree by polishing using the polishing composition. The average primary particle size of the silica (abrasive grains) is 5 nm or more and 200 nm or less in a preferable embodiment, 10 nm or more and 100 nm or less in a more preferable embodiment, and 20 nm or more and 50 nm or less in a particularly preferable embodiment. Incidentally, the average primary particle size of the silica (the diameter of the silica particles (primary particles)) can be calculated, for example, on the basis of the specific surface area (SA) of the silica particles calculated by the BET method on the assumption that the shape of the silica particles is true spherical. In the present specification, a value measured by a method described in the following Examples is employed as the average primary particle size of the silica.

Further, the average secondary particle size of the silica (silica abrasive grains) is preferably 25 nm or more, more preferably 35 nm or more, and further preferably 55 nm or more. As the average secondary particle size of the silica increases, the resistance during polishing decreases, and thus polishing can be stably performed. In addition, the average secondary particle size of the silica particles is preferably 1 μm or less, more preferably 500 nm or less, and further preferably 100 nm or less. As the average secondary particle size of the colloidal silica particles decreases, the surface area per unit mass of the colloidal silica particles increases, the frequency of contact to the object to be polished is improved, and the polishing efficiency is improved. The average secondary particle size of the silica (abrasive grains) is 25 nm or more and 1 μm or less in a preferable embodiment, 35 nm or more and 500 nm or less in a more preferable embodiment, and 55 nm or more and 100 nm or less in a particularly preferable embodiment. In the present specification, a value measured by a method described in the following Examples is employed as the average secondary particle size of the silica. Incidentally, values of the degree of association (the average secondary particle size/the average primary particle size) calculated from those values are also not particularly limited, and for example, are 1.5 to 5.0 and preferably about 1.8 to 4.0.

For example, the density in the colloidal silica (abrasive grains) also varies depending on a production method (for example, a sol-gel method, a soda silicate method, or the like). In addition, even in the case of employing one production method (for example, a sol-gel method), the porosity changes due to a reaction temperature, a time for reaction, or the like. Since the porosity is considered to affect hardness of silica itself, it is preferable to figure out the true density. Herein, in consideration of the hardness of the silica, the true density of the silica (abrasive grains) is preferably more than 1.70 g/cm$^3$, more preferably 1.80 g/cm$^3$ or more, further preferably 1.90 g/cm$^3$ or more, and particularly preferably 2.07 g/cm$^3$ or more. According to a more preferable embodiment of the present invention, the silica has a true density of 1.80 g/cm$^3$ or more. According to a still more preferable embodiment of the present invention, the silica has a true density of 1.90 g/cm$^3$ or more. According to a particularly preferable embodiment of the present invention, the silica has a true density of 2.07 g/cm$^3$ or more. In addition, the upper limit of the true density of the silica is preferably 2.20 g/cm$^3$ or less, more preferably 2.18 g/cm$^3$ or less, and particularly preferably 2.15 g/cm$^3$ or less. The true density of the silica (abrasive grains) is more than 1.70 g/cm$^3$ and 2.20 g/cm$^3$ or less in a preferable embodiment, 1.80 g/cm$^3$ or more and 2.18 g/cm$^3$ or less in a more preferable embodiment, 1.90 g/cm$^3$ or more and 2.15 g/cm$^3$ or less in a further preferable embodiment, and 2.07 g/cm$^3$ or more and 2.15 g/cm$^3$ or less in a particularly preferable embodiment. In the present specification, a value measured by a method described in the following Examples is employed as the true density of the silica (abrasive grains).

The BET specific surface area of the silica (abrasive grains) is not particularly limited, and is preferably 50 m$^2$/g or more, more preferably 60 m$^2$/g or more, and further preferably 70 m$^2$/g or more. Further, the upper limit of the BET specific surface area of the silica is preferably 120 m$^2$/g or less and more preferably less than 95 m$^2$/g. From the viewpoint of the balance between the enhancement of the polishing speed and the reduction of scratches (defects), the BET specific surface area of the silica (abrasive grains) is 50 m$^2$/g or more and 120 m$^2$/g or less in a preferable embodiment, 60 m$^2$/g or more and less than 95 m$^2$/g in a more preferable embodiment, and 70 m$^2$/g or more and less than 95 m$^2$/g in a further preferable embodiment. In the present specification, a value measured by a method described in the following Examples is employed as the BET specific surface area of the silica (abrasive grains).

Furthermore, the silica may be surface-modified. In the case of the surface-modified silica as the abrasive grains, colloidal silica with organic acid or organic amine immobilized thereto is preferably used. Such immobilization of the organic acid or organic amine to surfaces of the colloidal silica contained in the polishing composition is made by, for example, chemically bonding functional groups of the organic acid or the organic amine with the surfaces of the colloidal silica. The organic acid or the organic amine is not immobilized to the colloidal silica just by allowing the colloidal silica and the organic acid or the organic amine to coexist. If immobilizing sulfonic acid that is a kind of such organic acid to the colloidal silica, for example, a method described in "Sulfonic acid-functionalized silica through quantitative oxidation of thiol groups," Chem. Commun. 246-247 (2003) can be adopted. Specifically, by coupling a silane coupling agent having thiol groups such as 3-mercaptopropyltrimethoxysilane with the colloidal silica, and subsequently oxidizing the thiol groups with hydrogen peroxide, the colloidal silica with the sulfonic acid immobilized to the surface thereof can be obtained. Alternatively, if immobilizing carboxylic acid to the colloidal silica, for example, a method described in "Novel Silane Coupling Agents Containing a Photolabile 2-Nitrobenzyl Ester for Introduction of a Carboxy Group on the Surface of Silica Gel," Chemistry Letters, 3, 228-229 (2000) can be adopted. Specifically, by coupling a silane coupling agent containing photolabile 2-nitrobenzyl ester with the colloidal silica and subsequently irradiation the colloidal silica with light, the colloidal silica with carboxylic acid immobilized to the surface thereof can be obtained. If immobilizing alkylamine that is a kind of such organic amine to the colloidal silica, a method described in JP 2012-211080 A (corresponding to US 2010/071272 A) can be adopted. Specifically, by coupling a silane coupling agent containing alkylamine groups such as 3-aminopropyltriethoxysilane with the colloidal silica, the colloidal silica with the organic amine immobilized to the surface thereof can be obtained.

The size (the average primary particle size, the average secondary particle size), the true density, and the BET specific surface area of the silica can be appropriately controlled by selecting a method for producing silica (abrasive grains), or the like.

The polishing composition contains silica as the abrasive grains. Herein, the content of the silica is not particularly limited. However, as described above, in the polishing composition of the present invention, even in the case of a small amount (low concentration) of the silica, the silica efficiently comes close to the object to be polished, so that the surface of the object to be polished can be efficiently polished. Specifically, the content (concentration) of the silica is preferably more than 0% by mass and 8% by mass or less with respect to the whole polishing composition. The lower limit of the content of the silica is more preferably 0.002% by mass or more, further preferably 0.02% by mass or more, and particularly preferably 0.1% by mass or more with respect to the whole polishing composition. Further, the upper limit of the content of the silica is more preferably less than 8% by mass, further preferably 5% by mass or less, and particularly preferably 2% by mass or less with respect to the whole polishing composition.

Particularly, when the amount of the silica is decreased as described, the reduction of scratches (defects) caused by collision of the abrasive grains against the object to be polished can be effectively achieved, which is preferable. The content of the silica is 0.002% by mass or more and 8% by mass or less in a preferable embodiment, 0.02% by mass or more and 5% by mass or less in a more preferable embodiment, and 0.1% by mass or more and 2% by mass or less in a further preferable embodiment with respect to the whole polishing composition. With such a range, both the enhancement of the polishing speed and the reduction of scratches (defects) can be achieved with a good balance while the cost is suppressed. Incidentally, in a case where the polishing composition contains two or more kinds of silica, the content of the silica means the total amount thereof.

The polishing composition of the present invention preferably contains a dispersing medium for dispersing each component. Examples of the dispersing medium may include water; alcohols such as methanol, ethanol, and ethylene glycol; ketones such as acetone; and a mixture thereof. It is preferable to include water. That is, according to a preferable embodiment of the present invention, the polishing composition further contains water. According to a more preferable embodiment of the present invention, the dispersing medium substantively includes water.

Incidentally, the term "substantively" is intended to mean that a dispersing medium other than water may be included as long as the objective effect of the present invention can be achieved, and more specifically, the dispersing medium include 90% by mass or more and 100% by mass or less of water and 0% by mass or more and 10% by mass or less of a dispersing medium other than water, and preferably includes 99% by mass or more and 100% by mass or less of water and 0% by mass or more and 1% by mass or less of a dispersing medium other than water. Most preferably, the dispersing medium is water. From the viewpoint that interference with the action of other components is suppressed, water not containing impurities as much as possible is preferable, and specifically, pure water, ultrapure water, or distilled water obtained by removing impurity ions with an ion exchange resin and removing foreign substance with filtration of a filter is preferable.

The polishing composition of the present invention has a feature in that the pH at 25° C. is less than 6.0. When the pH of the polishing composition at 25° C. is 6.0 or more, the polishing speed is decreased and scratches are also likely to occur. The pH of the polishing composition at 25° C. is preferably 5.0 or less and particularly preferably 4.0 or less. The lower limit of the pH of the polishing composition at 25° C. is preferably 1.0 or more, more preferably 2.0 or more, and particularly preferably 3.0 or more. Incidentally, in the present specification, unless otherwise specified, "pH" means "pH at 25° C." The pH of the polishing composition at 25° C. is preferably 1.0 or more and less than 6.0 in a preferable embodiment, 2.0 or more and less than 6.0 in a more preferable embodiment, 3.0 or more and less than 6.0 in a further preferable embodiment, and 3.0 or more and 4.0 or less in a particularly preferable embodiment. With such a pH of the polishing composition, silica (abrasive grains) can be stably dispersed. In the present specification, a value measured at 25° C. by a pH meter (model number: LAQUA, manufactured by HORIBA, Ltd.) is employed as the pH.

The pH can be adjusted by adding an appropriate amount of a pH adjusting agent. That is, the polishing composition may be further the pH adjusting agent. Herein, the pH adjusting agent, which is used as necessary for adjusting the pH of the polishing composition to a desired value, may be either acid or alkali, and may be either an inorganic compound or an organic compound. Specific examples of the acid include inorganic acids such as sulfuric acid, nitric acid, boric acid, carbonic acid, hypophosphorous acid, phosphorus acid, and phosphoric acid; and organic acids including: carboxylic acid such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid; organic sulfuric acid such as methanesulfonic acid, ethanesulfonic acid, and isethionic acid; and organic acids including organic phosphoric acid such as phytic acid and hydroxyethylidene diphosphonic acid. Since the polishing composition according to one aspect of the present invention has a relatively low pH of less than 6.0, in an embodiment, the polishing composition further contains an acid.

Specific examples of the alkali include hydroxides of alkali metal such as potassium hydroxide, amines such as ammonia, ethylenediamine, and piperazine, and quaternary ammonium salts such as tetramethylammonium and tetraethylammonium. These pH adjusting agents can be used alone or as a mixture of two or more kinds thereof.

In the polishing composition according to one aspect of the present invention, other components such as an oxidizing agent, a metal anticorrosive, an antiseptic agent, an antifungal agent, a water-soluble polymer, and an organic solvent for dissolving an insoluble organic matter may be further contained as necessary. Hereinafter, the oxidizing agent, the metal anticorrosive, the antiseptic agent, and the antifungal agent as preferable other components will be described.

(Oxidizing Agent)

The oxidizing agent that can be added to the polishing composition has an effect for oxidizing the surface of the object to be polished so as to enhance the polishing speed of the object to be polished by the polishing composition.

Examples of the usable oxidizing agent include hydrogen peroxide, sodium peroxide, barium peroxide, ozone water, silver(II) salts, iron(III) salts, permanganic acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, and salts thereof, and the like. These oxidizing agents may be used alone or as a mixture of two or more kinds thereof.

The content of the oxidizing agent in the polishing composition is preferably 0.1 g/L or more, more preferably 1 g/L or more, and further preferably 3 g/L or more. As the content of the oxidizing agent increases, the polishing speed of the object to be polished by the polishing composition is further enhanced.

The content of the oxidizing agent in the polishing composition is preferably 200 g/L or less, more preferably 100 g/L or less, and further preferably 40 g/L or less. As the content of the oxidizing agent decreases, the material cost of the polishing composition can be suppressed and a treatment of the polishing composition after being used for the polishing, that is, a load on a waste water treatment can be reduced. Further, possibility that the surface of the object to be polished is excessively oxidized by the oxidizing agent can also be reduced.

(Metal Anticorrosive)

Addition of the metal anticorrosive into the polishing composition can suppress generation of a hollow on a side of a wiring formed by polishing using the polishing composition. Further, the addition of the metal anticorrosive can also suppress generation of dishing on the surface of the object to be polished after being polished using the polishing composition.

The usable metal anticorrosive is not particularly limited, and is preferably a heterocyclic compound or a surfactant. The number of heterocyclic rings in the heterocyclic compound is not particularly limited. Further, the heterocyclic compound may be a monocyclic compound or a polycyclic compound having a fused ring. The metal anticorrosive may be used alone or as a mixture of two or more kinds thereof. Further, a commercial product or a synthetic product may be used as the metal anticorrosive.

Specific examples of the heterocyclic compound that can be used as the metal anticorrosive include nitrogen-containing heterocyclic compounds such as a pyrrolic compound, a pyrazole compound, an imidazole compound, a triazole compound, a tetrazole compound, a pyridine compound, a pyrazine compound, a pyridazine compound, a pyrimidine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a pteridin compound, a thiazole compound, an isothiazole compound, an oxazole compound, an isoxazole compound, and a furazan compound.

(Antiseptic Agent and Antifungal Agent)

Examples of the antiseptic agent and the antifungal agent used in the present invention include isothiazolin-based antiseptic agents such as 2-methyl-4-isothiazolin-3-one and 5-chloro-2-methyl-4-isothiazolin-3-one; paraoxybenzoic acid esters; phenoxyethanol; and the like. These antiseptic agents and antifungal agents may be used alone or as a mixture of two or more kinds thereof.

<Method for Producing Polishing Composition>

The method for producing a polishing composition of the present invention is not particularly limited, and for example, a polishing composition can be obtained by stirring and mixing abrasive grains and, as necessary, other components, for example, in a dispersing medium. That is, in one aspect of the present invention, there is provided a method for producing a polishing composition to be used for polishing an object to be polished, the method including: preparing silica of which a maximum peak height in a weight change rate distribution curve obtained by thermogravimetric measurement in a range of 25° C. or higher and 250° C. or lower is −0.011 or more and less than 0; and mixing the silica with water.

Herein, as described above, in order to adjust the maximum peak height in the weight change rate distribution curve obtained by the thermogravimetric measurement in a range of 25° C. or higher and 250° C. or lower to be −0.011 or more and less than 0, the surface state of the silica may be controlled by the hydrothermal treatment, the surface modification, or the like.

The temperature at the time of mixing respective components is not particularly limited, and is preferably 10 to 40° C., and heating may be performed in order to increase a rate of dissolution. Further, the mixing time is also not particularly limited.

<Object to be Polished>

In the present invention, the object to be polished is not particularly limited, and examples thereof include a metal, an object to be polished which has an oxygen atom and a silicon atom, an object to be polished which has a silicon-silicon bond, and an object to be polished which has a nitrogen atom and a silicon atom.

Examples of the metal include copper, aluminum, hafnium, cobalt, nickel, titanium, tungsten, and the like.

Examples of the object to be polished which has an oxygen atom and a silicon atom include silicon oxide ($SiO_2$), a hydrolysis condensate of tetraethylorthosilicate (TEOS), and the like.

Examples of the object to be polished which has a silicon-silicon bond include polysilicon, amorphous silicon, monocrystalline silicon, n-type doped monocrystalline silicon, p-type doped monocrystalline silicon, and a Si-based alloy such as SiGe.

Examples of the object to be polished which has a nitrogen atom and a silicon atom include a silicon nitride film and an object to be polished which has a silicon-nitrogen bond such as silicon carbonitride (SiCN).

These materials may be used alone or in combination of two or more kinds thereof.

Among them, in the case of an object to be polished containing an oxygen atom and a silicon atom, further, in the case of an object to be polished containing a bond of an oxygen atom and a silicon atom, the effect of the present invention can be more effectively exhibited, and in the case of an object to be polished containing silicon oxide using tetraethylorthosilicate (TEOS) as a raw material, the effect of the present invention can be further effectively exhibited. That is, according to a preferable embodiment of the present invention, the polishing composition of the present invention is used for polishing an object to be polished containing an oxygen atom and a silicon atom. Further, according to a particularly preferable embodiment of the present invention, an object to be polished is a silicon oxide substrate using tetraethylorthosilicate as a raw material.

Incidentally, the object to be polished is preferably a material containing an oxygen atom and a silicon atom, but even in this case, may contain other materials than the above-described materials. Examples of the other materials include silicon nitride (SiN), silicon carbide (SiC), sapphire ($Al_2O_3$), silicon-germanium (SiGe), and the like.

<Polishing Method and Method for Producing Substrate>

As described above, the polishing composition according to one aspect of the present invention or a polishing composition produced by the production method is particularly suitably used in polishing of an object to be polished containing an oxygen atom and a silicon atom. Therefore, according to one aspect of the present invention, there is provided a polishing method including: polishing an object to be polished containing an oxygen atom and a silicon atom by using the above-described polishing composition; or obtaining a polishing composition by the above-described production method and polishing the object to be polished by using the polishing composition. Further, according to a preferable embodiment of the present invention, there is provided a polishing method including: polishing an object to be polished containing silicon oxide using tetraethylorthosilicate (TEOS) as a raw material by using the polishing composition of the present invention; or obtaining a polishing composition by the above-described production method and polishing the object to be polished by using the polishing composition.

As a polishing device, it is possible to use a general polishing device provided with a holder for holding a substrate or the like having an object to be polished, a motor or the like having a changeable rotation speed, and a polishing table to which a polishing pad (polishing cloth) can be attached.

As the polishing pad, a general nonwoven fabric, polyurethane, a porous fluororesin, or the like can be used without any particular limitation. The polishing pad is preferably groove-processed such that a polishing liquid can be stored therein.

Polishing conditions are not also particularly limited, and for example, the rotation speed of the polishing table (platen) is preferably 10 to 500 rpm and the pressure (polishing pressure) applied to a substrate having an object to be polished is preferably 0.5 to 10 psi. A method for supplying the polishing composition to a polishing pad is not also particularly limited, and for example, a method in which the polishing composition is supplied continuously using a pump or the like is employed. The supply amount thereof is not limited, and a surface of the polishing pad is preferably covered all the time with the polishing composition according to one aspect of the present invention.

After completing the polishing, the substrate is washed in flowing water, and is dried by shaking off water drops that are attached to the substrate by a spin drier or the like, thereby obtaining the substrate containing an oxygen atom and a silicon atom.

The polishing composition of the present invention may be a one-component type or a multi-component type including a two-component type in which a part or a whole of the polishing composition is mixed at any mixing ratio. Further, in the case of using a polishing device having a plurality of supply paths for the polishing composition, two or more polishing compositions prepared in advance may be used so that the polishing compositions can be mixed on the polishing device.

Further, the polishing composition according to one aspect of the present invention may be an undiluted solution, or may be prepared by diluting an undiluted solution of a polishing composition with water. In a case where the polishing composition is the two-component type, an order of mixing and diluting is arbitrary, and examples thereof include: diluting one of the compositions with water and then mixing the compositions together; diluting the compositions with water simultaneously with mixing; diluting the mixed polishing compositions with water; and the like.

EXAMPLES

The present invention will be described in more detail by means of the following Examples and Comparative Examples. However, the technical scope of the present invention is not limited only to the following Examples. Incidentally, unless otherwise specified, "%" and "part(s)" respectively mean "% by mass" and "part(s) by mass." Further, in the following Examples, unless otherwise specified, operations were carried out under conditions at room temperature (25° C.)/relative humidity of 40 to 50% RH.

Incidentally, the average primary particle size (nm), the average secondary particle size (nm), the true density (g/cm$^3$), the BET specific surface area (m$^2$/g), and the TG peak height of the silica (abrasive grains) were measured by the following methods.

[Average Particle Size (nm) of Silica]

The average primary particle size (nm) of the silica (abrasive grains) was calculated on the basis of the average value of the specific surface area (SA) of the silica particles of about 0.2 g of a silica sample calculated from values measured by the BET method 3 to 5 times on the assumption that the shape of the silica particles is true spherical. Incidentally, a value of the degree of association (the average secondary particle size/the average primary particle size) can also be calculated from those values.

The average secondary particle size (nm) of the silica (abrasive grains) was measured with respect to a silica sample by using a dynamic light scattering type particle size distribution measuring apparatus (UPA-UT151, manufactured by NIKKISO CO., LTD). First, the abrasive grains were dispersed in pure water to prepare a dispersion liquid having a loading index (scattering intensity of laser light) of 0.01. Subsequently, the value of the volume average particle size My at UT mode was continuously measured using the dispersion liquid 3 to 5 times, and then an average value of the obtained values was regarded as the average secondary particle size.

[True Density (g/cm$^3$) of Silica]

The true density (g/cm$^3$) of the silica (abrasive grains) is measured by the following method. Specifically, first, an aqueous solution of silica is put into a crucible to be an amount of about 15 g as the solid content (silica), and moisture is evaporated at about 200° C. using a commercially available hot plate. Further, in order to remove moisture remaining in the pores of the silica as well, a thermal treatment is performed at 300° C. for 1 hour using an electric furnace (manufactured by Advantech Co., Ltd., firing furnace) and dry silica after the treatment is ground with a mortar. Subsequently, 10 g of the dry silica produced above is put into a 100-ml pycnometer (Wa (g)) of which weight is measured with a microbalance (manufactured by A&D Company, Limited, GH-202) in advance, the weight is measured (Wb (g)), followed by adding 20 ml of ethanol and degassing is performed for 30 minutes in a depressurized desiccator. Thereafter, ethanol is filled in the pycnometer, the pycnometer is sealed with a stopper, and then the weight is measured (Wc (g)). The contents of the pycnometer in which the weight measurement of the silica is completed are discarded, ethanol is filled in the pycnometer after washing, and then the weight is measured (Wd (g)). The true density is calculated by Formula 1 and Formula 2 from those weights and the temperature (t (° C.)) of ethanol at the time of measurement.

[Mathematical Formula 1]

$$Ld = 0.80653 - 0.000867 \times t \qquad \text{Formula 1:}$$

In the above Formula 1, Ld represents the specific weight (g/cm$^3$) of ethanol at t° C.

[Mathematical Formula 2]

$$Sg = (Wb - Wa)/(Wd - Wc + Wb - Wa) \times Ld \qquad \text{Formula 2:}$$

In the above Formula 2, Sg represents the true density (g/cm$^3$) of the silica;

Wa represents the weight (g) of the pycnometer;

Wb represents the total weight (g) of the sample (dry silica) and the pycnometer;

Wc represents the total weight (g) of the sample (dry silica), ethanol, and the pycnometer;

Wd represents the total weight (g) of ethanol and the pycnometer; and

Ld represents the specific weight (g/cm$^3$) of ethanol obtained in the above Formula 1.

[BET Specific Surface Area (m$^2$/g) of Silica]

The specific surface area (m$^2$/g) of the silica (abrasive grains) is measured using the BET method. Specifically, the sample (silica) is heated at 105° C. for 12 hours or longer to remove moisture. The dried silica is ground with a mortar, about 0.2 g of silica is put into a cell of which weight is measured in advance (Wa' (g)), the weight is measured (Wb' (g)), and then the cell is kept warm at 180° C. for 5 minutes or longer at a heating portion of a specific surface area meter (manufactured by SHIMADZU CORPORATION, Flowsorb II 2300). Thereafter, the cell is attached to a measurement portion, and the adsorption area (A [m$^2$]) at the time of degassing is measured. The specific surface area SA [m$^2$/g] is obtained using the A value by the following Formula 3.

[Mathematical Formula 3]

$$SA = A/(Wb' - Wa') \qquad \text{Formula 3:}$$

In the above Formula 3, SA represents the BET specific surface area (m$^2$/g) of the silica;

A represents the adsorption area (m$^2$) at the time of degassing;

Wa' represents the weight (g) of the cell; and

Wb' represents the total weight (g) of the sample (dry silica) and the cell.

[Thermogravimetric Measurement (TG)]

TG is an analytical method of detecting a change in weight of a sample when a temperature of a measurement sample is changed according to a certain program, and obtains data which is plotted as a temperature function. First, silica as the measurement sample is dried at 105° C. for 24 hours and ground with an agate mortar, and then free moisture is removed. The dried sample is weighed to be about 30 mg and put into an alumina pan, and measurement is performed using a TG measuring machine (Thermo plus Evo (manufactured by Rigaku Corporation)). α-alumina is used as a reference sample. At the time of measurement, first, the temperature of the measurement portion is increased to 150° C. at 2° C./min, and excess moisture is evaporated. According to this, an influence of a difference in moisture absorption caused by a difference in still standing time after drying is excluded. Thereafter, the sample is left to stand still for 40 minutes in an atmosphere of a relative humidity of 70% RH and 25° C. so that the moisture is absorbed on the sample. Immediately after the temperature of the measurement portion is decreased to 25° C., the temperature of the measurement portion is increased to 250° C. at 1° C./min, and a thermogravimetric change over time is observed every 0.5 minutes. The weight change rate per unit area (weight change rate) is calculated from the change in weight obtained by measurement. The weight change rate is plotted on the vertical axis, the measurement temperature is plotted on the horizontal axis, and then Gaussian fitting is performed to obtain a weight change rate distribution curve, thereby obtaining the maximum peak height (TG peak height). Incidentally, a weight change rate ($\Delta W$) between a measurement point n−1 (a sample weight $W_{n-1}$, a measurement temperature $T_{n-1}$) and the next measurement point n (a sample weight $W_n$, a measurement temperature $T_n$) is a value calculated by the following Formula 4.

[Mathematical Formula 4]

$$\text{Weight change rate } (\Delta W) = (W_n - W_{n-1})/((T_n - T_{n-1}) \times SA) \quad \text{Formula 4:}$$

In the above Formula 4, $W_{n-1}$ and $T_{n-1}$ represent the sample weight and the measurement temperature at the measurement point n−1, respectively;

$W_n$ and $T_n$ represent the sample weight and the measurement temperature at the measurement point n next to the measurement point n−1, respectively; and SA represents the BET specific surface area ($m^2/g$) of the silica.

Comparative Example 1

Figure 2:
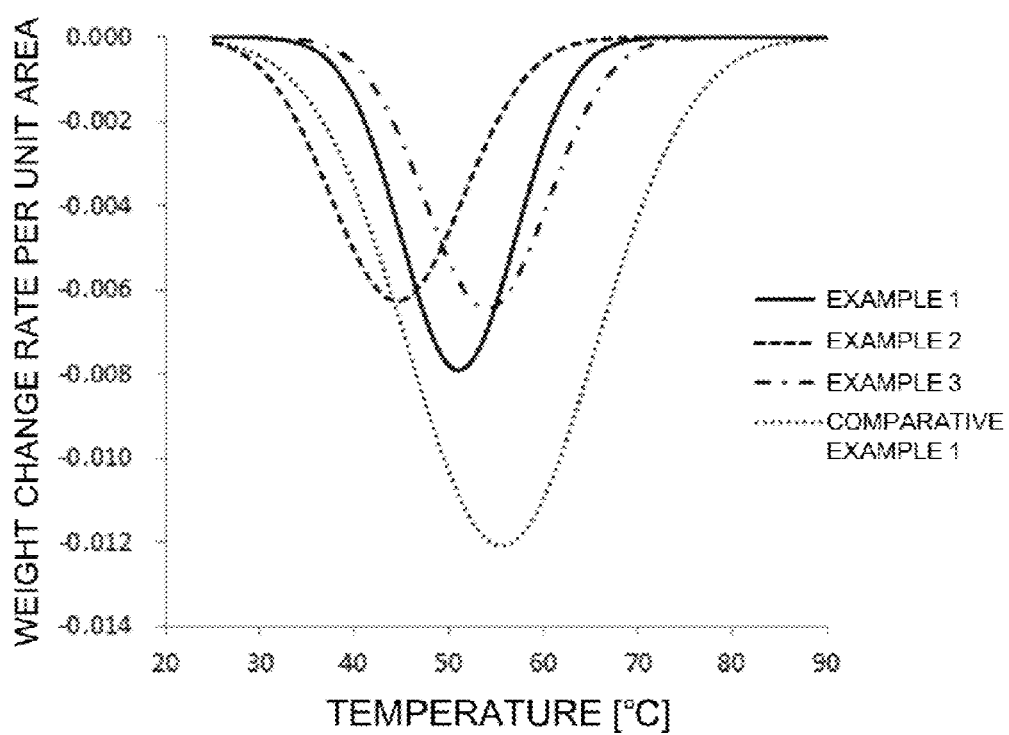
FIG. 2 is a weight change rate distribution curve obtained by subjecting abrasive grains used in Examples and Comparative Examples to thermogravimetric measurement.

As the abrasive grains, abrasive grains 1 were prepared. The abrasive grains 1 are colloidal silica, which is produced by a sol-gel method, having an average primary particle size of 35 nm, an average secondary particle size of 67 nm, a degree of association of 1.9, a BET specific surface area of 78 $m^2/g$, a true density of 1.8 $g/cm^3$, and a TG peak height of −0.0121. The weight change rate distribution curve of the abrasive grains 1 (Comparative Example 1) obtained by thermogravimetric measurement is shown in FIG. 2.

The above-described abrasive grains 1 were stirred and dispersed into a dispersing medium (pure water) so that the concentration of the abrasive grains 1 in the composition would be 1% by mass, and lactic acid as a pH adjusting agent was added so that the pH of the polishing composition would be 4.0, thereby producing a polishing composition (polishing composition 1) (mixing temperature: about 25° C., mixing time: about 10 minutes). Incidentally, the pH of the polishing composition (liquid temperature: 25° C.) was checked by a pH meter (model number: LAQUA, manufactured by HORIBA, Ltd.).

Example 1

A polishing composition 2 was prepared by a similar method to Comparative Example 1, except that abrasive grains 2 obtained by subjecting the abrasive grains 1 to the hydrothermal treatment under the following condition were used. That is, 1 kg of the abrasive grains 1 were put into a band heater type autoclave (TAS-1 type manufactured by Taiatsu Techno Corporation) (silica concentration: 19.5% by mass, pH: 7.3). This apparatus has a mechanism in which the temperature is controlled by a band heater closely attached to a container and the inside of the apparatus applies heat evenly to a sample under stirring. The hydrothermal treatment was performed by program operation while room temperature (25° C.) was set as a starting point, the temperature increasing rate was set to 1.75° C./min, the highest temperature was set to 160° C., the time for maintaining the highest temperature (160° C.) was set to 1 hour and 45 minutes, and the pressure at the highest temperature (160° C.) was set to 0.63 MPa. The abrasive grains in which the hydrothermal treatment is completed returned immediately to room temperature environment such that the heating time did not become excessively long. According to the above-described method, the abrasive grains 2 were obtained.

The abrasive grains 2 obtained by the hydrothermal treatment had an average primary particle size of 35 nm, an average secondary particle size of 67 nm, a degree of association of 1.9, a BET specific surface area of 68 $m^2/g$, a true density of 1.8 $g/cm^3$, and a TG peak height of −0.0079. The weight change rate distribution curve of the abrasive grains 2 (Example 1) obtained by the thermogravimetric measurement is shown in FIG. 2.

Comparative Example 2

As the abrasive grains, abrasive grains 3 were prepared. The abrasive grains 3 are colloidal silica, which is produced by a sol-gel method, having an average primary particle size of 32 nm, an average secondary particle size of 61 nm, a degree of association of 1.9, a BET specific surface area of 90 $m^2/g$, a true density of 2.1 $g/cm^3$, and a TG peak height of −0.0062.

The above-described abrasive grains 3 were stirred and dispersed into a dispersing medium (pure water) so that the concentration of the abrasive grains 3 in the composition would be 1% by mass and the pH would be 8.0, thereby producing a polishing composition (polishing composition 3) (mixing temperature: about 25° C., mixing time: about 10 minutes). Ammonia was used for adjustment of the pH.

Example 2

A polishing composition was produced by adding lactic acid as a pH adjusting agent such that the pH of the polishing composition would be 4.0 in Comparative Example 2. A polishing composition 4 was produced in a similar manner to Comparative Example 2 except the above description. The weight change rate distribution curve of the abrasive grains 3 (Example 2) obtained by thermogravimetric measurement is shown in FIG. 2.

Comparative Example 3

As the abrasive grains, abrasive grains 4 were prepared. The abrasive grains 4 are colloidal silica, which is produced by a sol-gel method, having an average primary particle size of 30 nm, an average secondary particle size of 62 nm, a degree of association of 2.1, a BET specific surface area of 95 m$^2$/g, a true density of 2.05 g/cm$^3$, and a TG peak height of −0.0064.

A polishing composition 5 was produced in a similar manner to Comparative Example 2, except that, in Comparative Example 2, the abrasive grains 4 were used instead of the abrasive grains 3 and the pH adjustment was not performed.

Example 3

A polishing composition 6 was produced in a similar manner to Example 2, except that, in Example 2, the abrasive grains 4 were used instead of the abrasive grains 3. The weight change rate distribution curve of the abrasive grains 4 (Example 3) obtained by the thermogravimetric measurement is shown in FIG. 2.

The polishing speed and defects (the number of scratches) of the polishing compositions obtained above were evaluated according to the following method. These results are presented in the following Table 1. Incidentally, in the following Table 1, "TEOS RR" means the polishing speed.

[Polishing Speed]

The polishing speed (TEOS RR) was measured when the object to be polished (a silicon oxide substrate using TEOS as a raw material) was polished using each of the polishing compositions obtained above.

(Polishing Condition)

Polishing device: small tabletop polishing device (manufactured by Engis Japan Corporation, EJ380IN)

Polishing pad: rigid polyurethane pad (manufactured by Nitta Haas Incorporated, IC1000)

Number of rotations of platen (table): 60 [rpm]
Number of rotations of head (carrier): 60 [rpm]
Polishing pressure: 3.0 [psi]
Flow rate of polishing composition (slurry): 100 [ml/min]
Polishing time: 1 [min]

The polishing speed (polishing rate) was evaluated by obtaining film thicknesses of the object to be polished before and after polishing by a light interference type film thickness measurement apparatus (manufactured by SCREEN Holdings Co., Ltd., Lambda AceVM2030) and dividing a difference between the film thicknesses by the polishing time (see a below formula).

$$\text{Polishing rate } [\text{Å}/\text{min}] = \frac{\text{Film thickness before polishing } [\text{Å}] - \text{Film thickness after polishing } [\text{Å}]}{\text{Polishing time } [\text{min}]} \quad [\text{Mathematical Formula 5}]$$

[Defects (Number of Scratches)]

Defects (the number of scratches) were evaluated using each of the polishing compositions obtained above according to the following method. Specifically, the number of scratches on a surface of the object to be polished was obtained by detecting defects of 0.13 μm or more on a whole surface of a wafer (however, excluding an area within 2 mm from its outer periphery) using a defect detection device (wafer surface inspection device) "Surfscan SP2" manufactured by KLA-Tencor 2 (KLA-TENCOR) Corporation. All of the detected defects were observed by a Review-SEM (RS-6000, manufactured by Hitachi High-Technologies Corporation) and then the number of the defects (scratches) was summed. The number of the obtained defects (scratches) was evaluated according to the following determination criteria.

(Scratch Determination Criteria)

⊙: The number of defects of 0.13 μm or more is 20 or less.

○: The number of defects of 0.13 μm or more is 21 or more and 30 or less.

Δ: The number of defects of 0.13 μm or more is 31 or more and 50 or less.

X: The number of defects of 0.13 μm or more is 51 or more.

TABLE 1

| | Colloidal silica (abrasive grains) | | | | | Polishing composition | | | |
|---|---|---|---|---|---|---|---|---|---|
| | Primary particle size (nm) | Secondary particle size (nm) | BET specific surface area (m$^2$/g) | True density (g/cm$^3$) | TG peak height | Silica concentration (% by mass) | pH adjusting pH agent | TEOS RR (Å/min) | Scratches |
| Comparative Example 1 | 35 | 67 | 78 | 1.80 | −0.0121 | 1.0 | 4.0 Lactic acid | 67 | X |
| Example 1 | 35 | 67 | 68 | 1.80 | −0.0079 | 1.0 | 4.0 Lactic acid | 931 | ○ |
| Comparative Example 2 | 32 | 61 | 90 | 2.10 | −0.0062 | 1.0 | 8.0 Ammonia | 20 | X |
| Example 2 | 32 | 61 | 90 | 2.10 | −0.0062 | 1.0 | 4.0 Lactic acid | 1563 | ⊙ |
| Comparative Example 3 | 30 | 62 | 95 | 2.05 | −0.0064 | 1.0 | 8.1 — | 31 | X |
| Example 3 | 30 | 62 | 95 | 2.05 | −0.0064 | 1.0 | 4.0 Lactic acid | 696 | Δ |

As clearly shown from the above Table 1, it is found that the polishing compositions of Examples further enhance the polishing speed of the TEOS substrate and can reduce scratches on the surface of the TEOS substrate even when the polishing compositions have a low concentration of the silica concentration of 1% by mass compared to the polishing compositions of Comparative Examples.

The present application is based on the Japanese patent application No. 2016-140624 filed on Jul. 15, 2016, and a disclosed content thereof is incorporated herein as a whole by reference.

The invention claimed is:

1. A polishing composition comprising silica of which a maximum peak height in a weight change rate distribution curve obtained by thermogravimetric measurement in a range of 25° C. or higher and 250° C. or lower is −0.011 or more and less than 0, a pH at 25° C. of the polishing composition being less than 6.0, wherein:
a true density of the silica is more than 1.70 g/cm$^3$ and 2.18 g/cm$^3$ or less;
the silica has an average primary particle size of 100 nm or less; and
the silica has a degree of association of 1.9 to 5.0.

2. The polishing composition according to claim 1, wherein the silica is colloidal silica.

3. The polishing composition according to claim 1, wherein a content of the silica is more than 0% by mass and 8% by mass or less with respect to the whole composition.

4. The polishing composition according to claim 1, wherein a true density of the silica is 1.80 g/cm$^3$ or more and 2.18 g/cm$^3$ or less.

5. The polishing composition of claim 1, wherein the silica is spherically-shaped.

6. The polishing composition of claim 1, wherein the silica has a BET specific surface area of 50 m$^2$/g or more and 120 m$^2$/g or less.

7. The polishing composition according to claim 1, further comprising water.

8. The polishing composition according to claim 7, further comprising an acid.

9. A polishing method comprising:
polishing an object to be polished containing an oxygen atom and a silicon atom by using the polishing composition according to claim 1.

10. A method for producing a polishing composition to be used for polishing an object to be polished, the method comprising:
preparing silica of which a maximum peak height in a weight change rate distribution curve obtained by thermogravimetric measurement in a range of 25° C. or higher and 250° C. or lower is −0.011 or more and less than 0; and
mixing the silica with water, wherein:
a true density of the silica is more than 1.70 g/cm$^3$ and 2.18 g/cm$^3$ or less;
the silica has an average primary particle size of 100 nm or less; and
the silica has a degree of association of 1.9 to 5.0.

11. The method of claim 10, wherein the silica is spherically-shaped.

12. The method of claim 10, wherein the silica has a BET specific surface area of 50 m$^2$/g or more and 120 m$^2$/g or less.

13. A polishing method comprising:
obtaining a polishing composition by the production method according to claim 10; and
polishing the object to be polished by using the polishing composition.

* * * * *